United States Patent
Ma et al.

(10) Patent No.: US 11,049,717 B2
(45) Date of Patent: Jun. 29, 2021

(54) METHOD FOR FABRICATING ULTRA-THIN GRAPHITE FILM ON SILICON CARBIDE SUBSTRATE FROM SILOXANE-COUPLING-GROUP-CONTAINING POLYAMIC ACID SOLUTION

(71) Applicant: National Chung-Shan Institute of Science and Technology, Taoyuan (TW)

(72) Inventors: Dai-Liang Ma, Taoyuan (TW); Cheng-Jung Ko, New Taipei (TW); Chia-Hung Tai, New Taipei (TW); Jun-Bin Huang, Taoyuan (TW); Bang-Ying Yu, Taoyuan (TW)

(73) Assignee: National Chung-Shan Institute of Science and Technology, Taoyuan (TW)

( * ) Notice: Subject to any disclaimer, the term of this patent is extended or adjusted under 35 U.S.C. 154(b) by 173 days.

(21) Appl. No.: 16/231,262

(22) Filed: Dec. 21, 2018

(65) Prior Publication Data

US 2020/0203162 A1 Jun. 25, 2020

(51) Int. Cl.
*C30B 1/02* (2006.01)
*H01L 21/02* (2006.01)
*C30B 29/36* (2006.01)
*C30B 33/02* (2006.01)

(52) U.S. Cl.
CPC .......... *H01L 21/02527* (2013.01); *C30B 1/02* (2013.01); *C30B 29/36* (2013.01); *H01L 21/02378* (2013.01); *C30B 33/02* (2013.01)

(58) Field of Classification Search
CPC .... C30B 1/00; C30B 1/02; C30B 1/10; C30B 5/00; C30B 7/00; C30B 7/14; C30B 29/00; C30B 29/02; C30B 29/04; C30B 29/36; H01L 21/02378; H01L 21/02527
USPC .......................... 117/4, 7–8, 11, 84, 928–929
See application file for complete search history.

(56) References Cited

U.S. PATENT DOCUMENTS

| 6,214,108 B1 * | 4/2001 | Okamoto | C30B 23/00 117/88 |
| 2015/0322218 A1 * | 11/2015 | Choi | C08G 73/14 525/436 |
| 2017/0029703 A1 * | 2/2017 | Chiou | C09K 19/56 |

FOREIGN PATENT DOCUMENTS

| CN | 106867256 A | * | 6/2017 |
| JP | 2013212938 A | * | 10/2013 |

* cited by examiner

*Primary Examiner* — Kenneth A Bratland, Jr.
(74) *Attorney, Agent, or Firm* — Winston Hsu

(57) ABSTRACT

A method for fabricating an ultra-thin graphite film on a silicon carbide substrate includes the steps of: (A) providing a polyamic acid solution and a siloxane-containing coupling agent for polymerizing under an inert gas atmosphere to form a siloxane-coupling-group-containing polyamic acid solution; (B) performing a curing process after applying the siloxane-coupling-group-containing polyamic acid solution to a silicon carbide substrate; (C) placing the silicon carbide substrate in a graphite crucible before placing the graphite crucible in a reaction furnace to perform a carbonization process under an inert gas atmosphere; (D) subjecting the silicon carbide substrate to a graphitization process to obtain a graphite film, thereby make it possible to fabricate an ultra-thin graphite film of high-quality on the surface of silicon carbide in a lower graphitization temperature range.

8 Claims, 5 Drawing Sheets

METHOD FOR FABRICATING ULTRA-THIN GRAPHITE FILM ON SILICON CARBIDE SUBSTRATE FROM SILOXANE-COUPLING-GROUP-CONTAINING POLYAMIC ACID SOLUTION

BACKGROUND OF THE INVENTION

1. Field of the Invention

The present invention generally relates to a method for the fabrication of a graphite film. In particular, the present invention is directed to a method for the fabrication of an ultra-thin graphite film on a silicon carbide substrate.

2. Description of the Prior Art

With the rapid development of the modern technology and of the quality of life, all kinds of 3C high-tech electronic products tend to become light, thin, short, small and multi-functional while semi-conductive materials, such as silicon carbide (SiC), group III nitrides (for example GaN, AlN) have been developed for use in various electronic devices. Silicon carbide (SiC) and group III nitrides not only have high physical strength and high corrosion resistance, but also have excellent electronic properties, including hardness of radiation, a high breakdown electric field, a wider band gap, a high electron saturated drift velocity and possibility to operate under high temperature.

Both physical vapor transport (PVT) and physical vapor deposition (PVD) are technologies which are used by the industry for the epitaxial growth of silicon carbide and of group III nitride. They are also used as a technology for the mass production of wafers. Physical Vapor Transport (PVT) mainly resides in using the material powder of silicon carbide (SiC) and of group III nitride which is sublimed in a hot zone of a high temperature furnace (a crucible) via the vapor migration of the silicon carbide (SiC) and of group III nitride which is promoted by a temperature gradient towards a substrate for the epitaxial growth process to complete the crystal growth. However, during the epitaxial growth which is driven by the physical vapor transport method, the deposition rate varies due to the inconsistent temperature gradient of a silicon carbide substrate along the radial direction. It causes structural defects, and thus increases crystal defects of SiC. Despite of significant improvements in recent years, these wafer defects are still present. Accordingly, in order to improve the temperature gradient of a silicon carbide substrate along the radial direction, it becomes a more important issue of how to fabricating a graphite film of high thermal conductivity on a silicon carbide substrate.

The conventional technology for forming an ultra-thin graphite structure on a silicon carbide substrate is to carry out a de-silicon reaction on a silicon carbide substrate in a high temperature and low pressure environment to prepare a graphene structure on the silicon carbide substrate. Although this method is able to obtain a higher thermal conductive graphene structure on the silicon carbide substrate, there are a lot of small holes present on the surface after the de-silicon reaction to result in more defects of silicon carbide during the epitaxial growth process because Si atoms are removed from the surface of silicon carbide during the fabrication process.

Therefore, it is still urgently needed in the industry to develop a method for fabricating an ultra-thin graphite film of high-quality on a silicon carbide substrate so as to obtain a highly oriented graphite film which is close to a single crystal graphite structure to avoid the defects of the silicon carbide crystal structure which occurs during the epitaxial growth process to jeopardize the application of the silicon carbide substrate. In such a way, the compromise between the efficiency and the quality can be well balanced, so as to fabricate a silicon carbide substrate with an ultra-thin graphite film of high quality which meets the demands of the industry.

SUMMARY OF THE INVENTION

In view of the above disadvantages of prior art, the main objective of the present invention is to provide a method for fabricating an ultra-thin graphite film on a silicon carbide substrate, to integrate a silicon carbide substrate, a graphite crucible, a reaction furnace, a polyamic acid solution, and a siloxane-containing coupling agent to obtain a silicon carbide substrate with an ultra-thin graphite film of high-quality.

In order to achieve the above objective, according to one aspect proposed by the present invention, a method for fabricating an ultra-thin graphite film on a silicon carbide substrate is provided.

The method includes the steps of:

(A) providing a polyamic acid solution and a siloxane-containing coupling agent for polymerizing under an atmosphere of an inert gas to form a siloxane-coupling-group-containing polyamic acid solution;

(B) carrying out a curing process after applying the siloxane-coupling-group-containing polyamic acid solution to a silicon carbide substrate;

(C) placing the silicon carbide substrate in a graphite crucible before placing the graphite crucible in a reaction furnace to carry out a carbonization process under the atmosphere of the inert gas;

(D) subjecting the silicon carbide substrate to a graphitization process to obtain a graphite film on the silicon carbide substrate.

In the present invention, the silicon carbide substrate may be a silicon carbide wafer, a silicon carbide ingot, a silicon carbide chip, and a silicon carbide block, with a thickness in a range from 10 μm to 10000 μm, and with a diameter in a range from 2 inches to 6 inches, to form an ultra-thin graphite film with a thickness 1 μm on a silicon carbide substrate.

In the above step (A), the polyamic acid solution may be synthesized by a polymeric condensation reaction from a diamine monomer and from a dicarboxylic acid anhydride monomer. The resultant polyamic acid has rigid rod structure monomers of aryl groups to effectively reduce the coefficient of thermal expansion.

The above-mentioned siloxane-containing coupling agent may be selected from one of a trimethoxyl silane with a terminal amino group and a triethoxyl silane with a terminal amino group, in which the siloxane modifies the polyimide to bond the dicarboxylic acid anhydride monomers with the terminal amino groups of the siloxane, thereby enhancing the adhesion strength between the polyimide and the silicon carbide substrate.

In the above process, a curing temperature of the curing process may be in a range from 180° C. to 450° C., a carbonization temperature of the carbonization process may be in a range from 900° C. to 1200° C., and the graphitization process may include a reaction condition of a reaction temperature in a range from 1800° C. to 2300° C. and of a reaction pressure in a range from 50 torr to 600 torr. In the process, the inert gas is selected from at least one of argon gas, helium gas, nitrogen gas and hydrogen gas. The present invention carries out the calcination of the carbonization and of the graphitization under an inert gas atmosphere with slow rise of the temperature and with different temperature programs to maintain the integrity and compactness of the film so as to fabricate an ultra-thin graphite film of high quality with a film thickness of 1 µm or less.

These and other objectives of the present invention will no doubt become obvious to those of ordinary skill in the art after reading the following detailed description of the preferred embodiment that is illustrated in the various figures and drawings.

DETAILED DESCRIPTION

The polyimide (PI) film for use in the present invention does not melt in the carbonization process, maintains the original film form, and a highly oriented graphite film which is close to a single crystal graphite structure is resultantly obtained after being subjected to a high temperature calcination (2800° C.~3200° C.) graphitization treatment because of a high proportion of the aromatic rings, high bonding energy and high symmetry in the PI structure so it relatively reflects various excellent properties, benefits such as thermal oxidation, high dimensional stability and high carbon yield. The present invention utilizes a siloxane to modify polyimides by bonding a dicarboxylic acid anhydride monomer to a terminal amino group of the siloxane, to further enhance the adhesion strength between the polyimide and the silicon carbide substrate. Under the temperature of the epitaxial growth of silicon carbide, the polyimide film completes the graphitizing transformation by silicon carbide vapor at a lower temperature (1800° C.-2300° C.) so as to enable the efficacy of a lowered graphitization temperature of the process in order to greatly improve the process conditions for preparing an ultra-thin graphite film on the surface of silicon carbide. Moreover, the present invention utilizes a siloxane to modify polyimides by bonding a dicarboxylic acid anhydride monomer to a terminal amino group of the siloxane, to further enhance the adhesion between the polyimide and the silicon carbide substrate. In other words, it also enhances the adhesion strength between the ultra-thin graphite film and the silicon carbide substrate.

The processing concept which is proposed by the present invention mainly includes:

(1) The polymerization of the polyimide mainly resides in the diamine monomers and the dicarboxylic acid anhydride monomers, so the aryl-group-containing rigid rod structure monomers are selected to reduce the coefficient of thermal expansion;

(2) mixing different siloxanes with polyamines to enhance the interface adhesion with SiC and at the same time to reduce the coefficient of thermal expansion and to enhance the dimensional stability;

(3) controlling the rotational speed of a wet spin coater to enable the film thickness and coverage integrity; and (4) carrying out the calcination of the carbonization and of the graphitization under an atmosphere of an inert gas along with slow rise of the temperature and with different temperature programs to maintain the film integrity and the film compactness.

Figure 1:
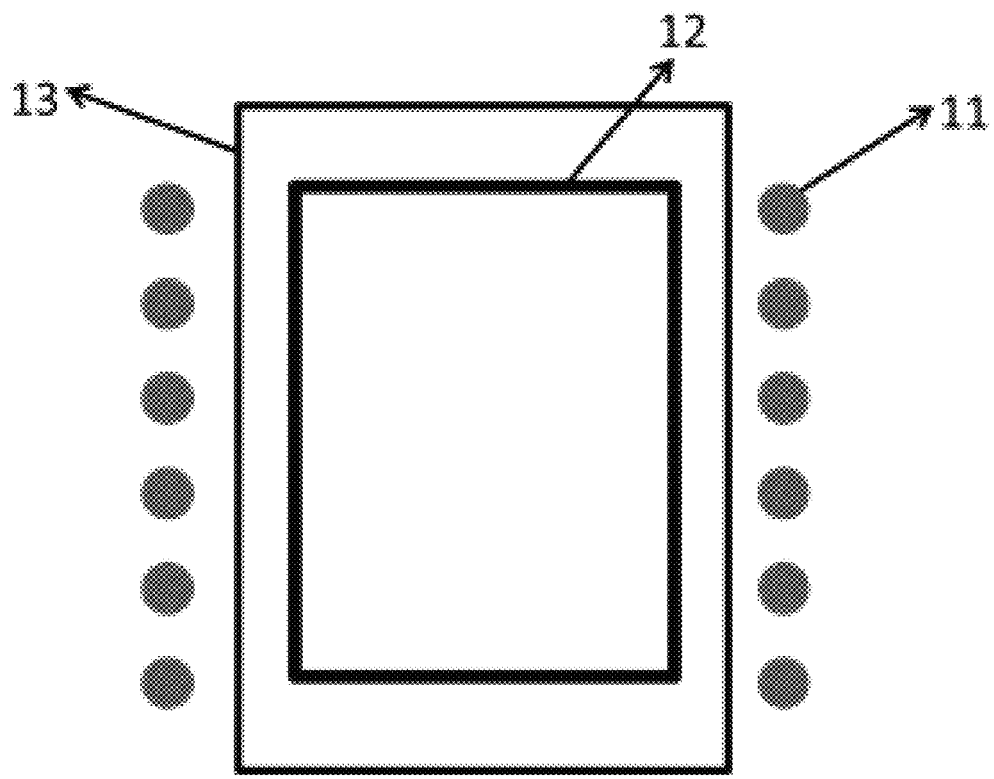
FIG. 1 illustrates a perspective view of an apparatus for fabricating an ultra-thin graphite film on a silicon carbide substrate according to the present invention.

Please refer to FIG. 1. FIG. 1 illustrates a perspective view of an apparatus for fabricating an ultra-thin graphite film on a silicon carbide substrate according to the present invention. As shown in FIG. 1, the reaction apparatus includes: a heat source 11 and a graphite crucible 12. The graphite crucible 12 includes a lid and a crucible body. The graphite crucible 12 is placed in a reaction furnace 13 and disposed at a relatively hot end of a thermal field. The crucible body has a deposition zone and a material source zone. The lid is disposed above the deposition zone, and the material source zone is disposed below the deposition zone.

Figure 2:
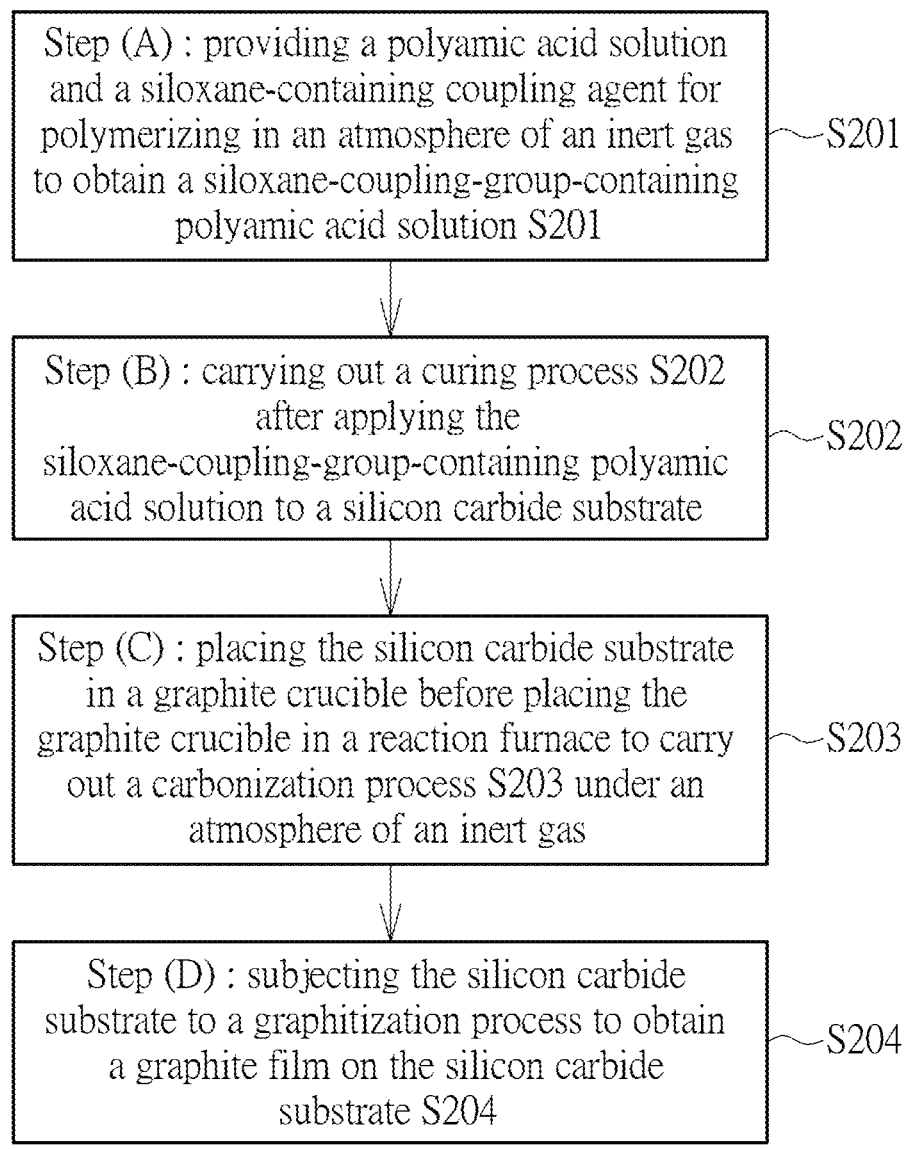
FIG. 2 illustrates a flow chart of a method for fabricating an ultra-thin graphite film on a silicon carbide substrate according to the present invention.

Please refer to FIG. 2. FIG. 2 illustrates a flow chart of a method for fabricating an ultra-thin graphite film on a silicon carbide substrate according to the present invention. As shown in FIG. 2, a method provided by the present invention for fabricating an ultra-thin graphite film on a silicon carbide substrate, includes the following steps of:

(A) providing a polyamic acid solution and a siloxane-containing coupling agent for polymerizing in an atmosphere of an inert gas to obtain a siloxane-coupling-group-containing polyamic acid solution S201;

(B) carrying out a curing process S202 after applying the siloxane-coupling-group-containing polyamic acid solution to a silicon carbide substrate;

(C) placing the silicon carbide substrate in a graphite crucible before placing the graphite crucible in a reaction furnace to carry out a carbonization process S203 under the atmosphere of an inert gas;

(D) subjecting the silicon carbide substrate to a graphitization process to obtain a graphite film on the silicon carbide substrate S204.

Example

The practice of the example is as follows:

First, diamine monomers are dissolved in a solvent (for example, NMP, DMAc, DMF) before dicarboxylic acid anhydride monomers are gradually added in to synthesize a polyamic acid via a polymeric condensation reaction. Next, a siloxane-containing coupling agent is added in to carry out the polymerization reaction under a nitrogen atmosphere. By adjusting the solid content and the rotational speed of the spin coater, the thickness on the silicon carbide substrate (0.1 µm~10 µm) can be controlled. By rising the temperature in a stepwise way, dehydration results in annulation to form a film. The polyimide film would be delaminated from the silicon carbide substrate during the curing process if the coating thickness exceeds 10 µm, and the polyimide film would be unable to completely cover the silicon carbide substrate if the thickness is less than 0.1 µm. Afterwards, the silicon carbide substrate which has been applied with the polyimide which contains the coupling reagent is placed in a graphite crucible, and a high-purity inert gas (one of argon gas, helium gas, nitrogen gas and hydrogen gas, or a mixture thereof with purity more than 99.999%) is introduced. Then, the temperature is raised to 900° C.~1200° C. and kept for 1~4 hours, subsequently it is heated to a reaction temperature of 1800° C.~2300° C. with the pressure dropped to a reaction pressure of 50 torr~600 torr for the reaction time of 1-4 hours to obtain a graphite thin film which is flatly attached to the surface of the silicon carbide substrate. It has been experimentally found out that the graphite thin film is less likely to flatly attach to the surface of the silicon carbide substrate if the pressure is higher than 600 torr, and it is disadvantageous to the formation of the graphite film if the pressure is lower than 50 torr because the silicon carbide substrate would adversely release too much amount of silicon carbide vapor.

Figure 3:
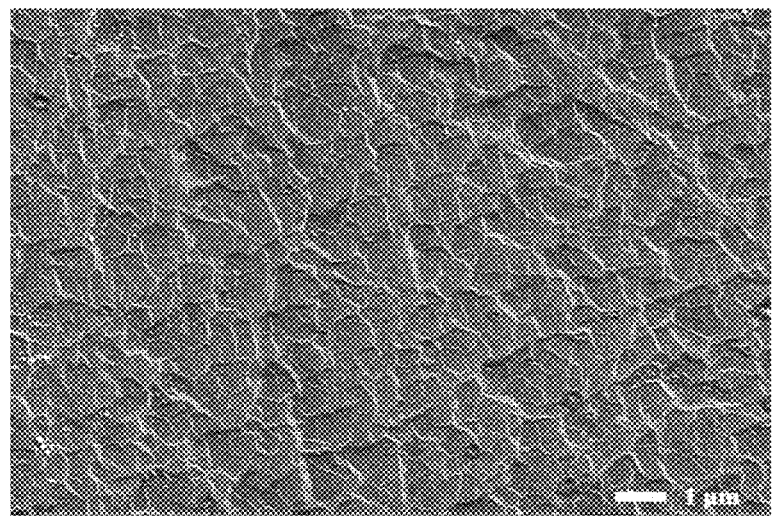
FIG. 3 illustrates a top view of an SEM image of a graphite film according to the example of the present invention.
Figure 4:
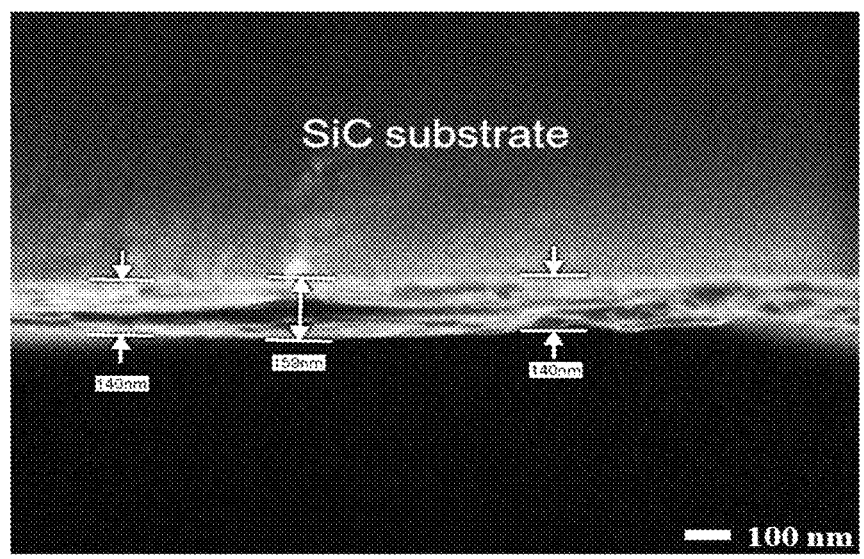
FIG. 4 illustrates a side view of the graphite film according to the example of the present invention.
Figure 5:
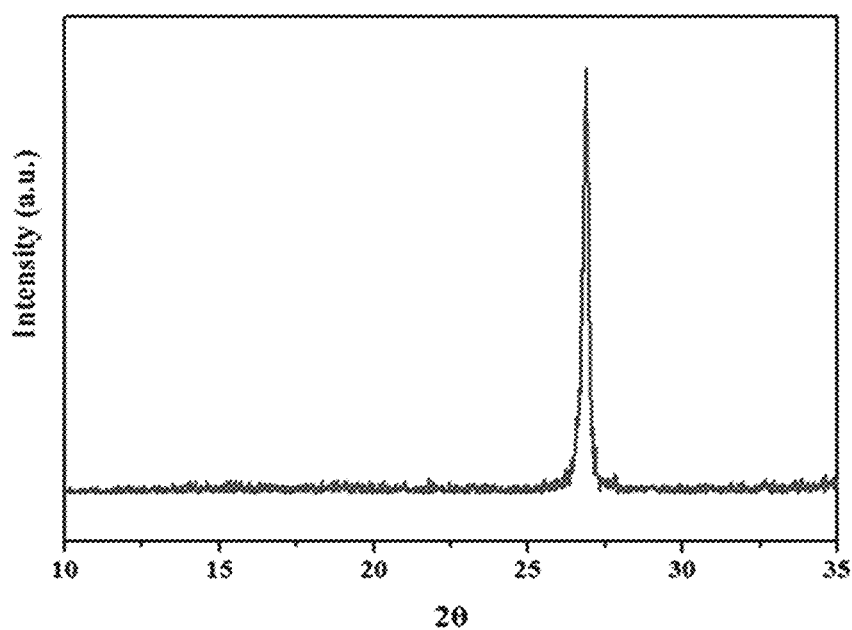
FIG. 5 illustrates an XRD pattern of the graphite film according to the example of the present invention.
Figure 6:
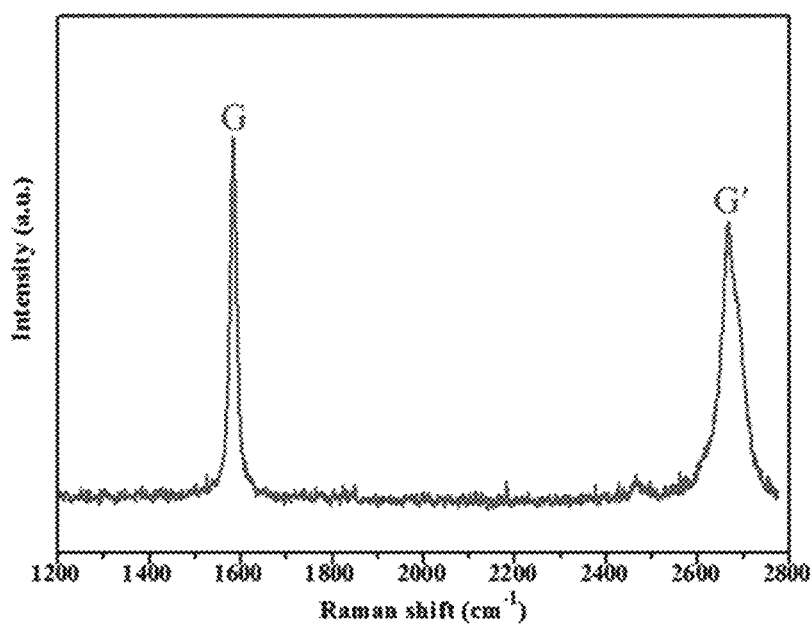
FIG. 6 illustrates a Raman spectrum of the graphite film according to the example of the present invention.
Figure 7:
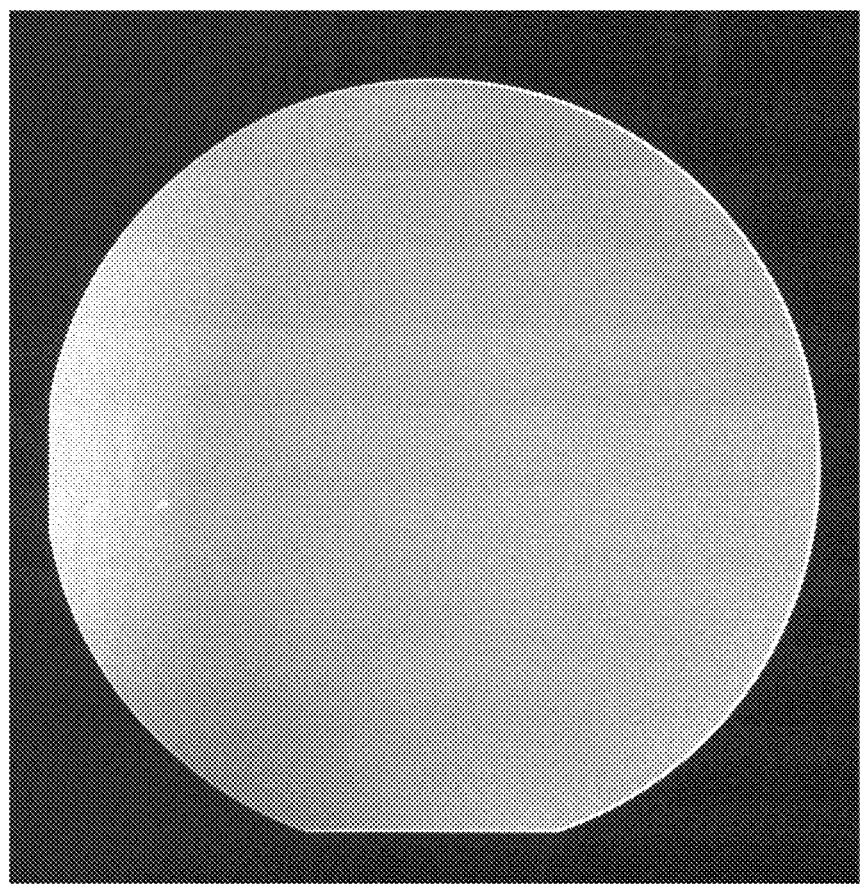
FIG. 7 illustrates an XRT pattern of the graphite film according to the example of the present invention.

Please refer to FIG. 3. FIG. 3 illustrates a top view of an SEM image of a graphite film according to the example of the present invention. Please refer to FIG. 4. FIG. 4 illustrates a side view of the graphite film according to the example of the present invention. Please refer to FIG. 5. FIG. 5 illustrates an XRD pattern of the graphite film according to the example of the present invention. Please refer to FIG. 6. FIG. 6 illustrates a Raman spectrum of the graphite film according to the example of the present invention. Please refer to FIG. 7. FIG. 7 illustrates an XRT pattern of the graphite film according to the example of the present invention. As shown in the drawings, the graphite film sample which is obtained by graphitization at 2200° C. is subjected to the SEM. It is observed that the originally orderless stacked carbon of the polyimide film with the addition of the siloxane coupling agent begins to rearrange after the graphitization treatment to yield an orderly stacked two-dimensional network graphite-like structure. It further completely covers the silicon carbide substrate without any broken hole (as shown in FIG. 3). In addition, it is observed that the film still retains a thickness of about 0.14 μm (as shown in FIG. 4) after the film undergoes the rearrangement of graphitization. The XRD analysis (as shown in FIG. 5) suggests that the diffraction peak (2θ) position of the graphitized graphite film sample is about 26.5° which is close to the theoretical single crystal graphite of 26.58° to exhibit a high degree of graphitization. Moreover, the Raman spectroscopy analysis (as shown in FIG. 6) suggests that the crystallinity of the material after the graphitization treatment is apparently improved because the segment at the G peak is a sharper curve. There are only the G peak (1560 cm$^{-1}$) and the G' peak (2700 cm$^{-1}$) present with the absence of the D peak (1350 cm$^{-1}$) in the drawing to suggest that the graphite film of the example of the present invention has no defects of the graphite structure because the D peak can be used to determine the defects of a graphite structure and no D peak is observed in the drawing so it is indeed an ultra-thin graphite film of high quality. The ultra-thin graphite film of high quality is suitable for the application of the epitaxial growth process of silicon carbide for use in protecting a silicon carbide substrate from the sublimation of the back side of the substrate or from the defects which are caused by the uneven temperature gradient along the radial direction during the epitaxial growth process. The above silicon carbide substrate with the graphite sample film of the present invention is further subjected to an epitaxial growth process and the silicon carbide wafer which is obtained from the silicon carbide crystal after a serious of procedures such as orientation, slicing, grinding and polishing is subjected to an XRT analysis (as shown in FIG. 7). It is found out in the drawing that the use of an ultra-thin graphite film to serve as a protecting layer of a silicon carbide substrate is able to greatly reduce the formation of defects.

The present invention overcomes the drawbacks of the prior art to be able to prepare of an ultra-thin graphite film on the surface of a silicon carbide substrate. A siloxane-containing coupling agent is used to increases the adhesion strength between the polyimide film and the silicon carbide substrate to avoid the delamination in the carbonization process and the use of the silicon carbide vapor which is released at a growth temperature of the single crystal at 1800° C.~2300° C. makes the completion in a lower temperature range of the graphitization process of the polyimide film which contains the coupling agent possible. At last, the silicon carbide substrate which has the attached ultra-thin graphite film of high quality is subjected to an epitaxial growth test of silicon carbide. The test result shows that it effectively reduces the formation of defects of the silicon carbide crystal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating an ultra-thin graphite film on a silicon carbide substrate, comprising steps of:
   (A) providing a polyamic acid solution and a siloxane-containing coupling agent for polymerizing under an atmosphere of an inert gas to form a siloxane-coupling-group-containing polyamic acid solution;
   (B) performing a curing process after applying said siloxane-coupling-group-containing polyamic acid solution to a silicon carbide substrate;
   (C) placing said silicon carbide substrate in a graphite crucible before placing said graphite crucible in a reaction furnace to perform a carbonization process under said atmosphere of said inert gas;
   (D) subjecting said silicon carbide substrate to a graphitization process so that a single crystal graphite structure is resultantly obtained from a graphitizing transformation of a polyimide film to obtain a graphite film consisting essentially of graphite on said silicon carbide substrate.

2. The method for fabricating an ultra-thin graphite film on a silicon carbide substrate according to claim 1, wherein said polyamic acid solution is synthesized by a polymeric condensation reaction from a diamine monomer and from a dicarboxylic acid anhydride monomer.

3. The method for fabricating an ultra-thin graphite film on a silicon carbide substrate according to claim 1, wherein said siloxane-containing coupling agent is selected from one of a trimethoxyl silane with a terminal amino group and a triethoxyl silane with a terminal amino group.

4. The method for fabricating an ultra-thin graphite film on a silicon carbide substrate according to claim 1, wherein a curing temperature of said curing process is in a range from 180° C. to 450° C.

5. The method for fabricating an ultra-thin graphite film on a silicon carbide substrate according to claim 1, wherein said inert gas is selected from at least one of an argon gas, a helium gas, a nitrogen gas and a hydrogen gas.

6. The method for fabricating an ultra-thin graphite film on a silicon carbide substrate according to claim 1, wherein a carbonization temperature of said carbonization process is in a range from 900° C. to 1200° C.

7. The method for fabricating an ultra-thin graphite film on a silicon carbide substrate according to claim 3, wherein said graphitization process comprises a reaction condition of a reaction temperature in a range from 1800° C. to 2300° C. and of a reaction pressure in a range from 50 torr to 600 torr.

8. The method for fabricating an ultra-thin graphite film on a silicon carbide substrate according to claim 1, wherein said graphite film has a thickness less than 1 μm.

* * * * *